(12) United States Patent
Goth et al.

(10) Patent No.: US 7,651,890 B2
(45) Date of Patent: Jan. 26, 2010

(54) METHOD AND APPARATUS FOR PREVENTION OF SOLDER CORROSION

(75) Inventors: Gary F. Goth, Pleasant Valley, NY (US); William P. Kostenko, Poughkeepsie, NY (US); John J. Loparco, Poughkeepsie, NY (US); Prabjit Singh, Poughkeepsie, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 11/532,329

(22) Filed: Sep. 15, 2006

(65) Prior Publication Data

US 2008/0067696 A1   Mar. 20, 2008

(51) Int. Cl.
H01L 23/26 (2006.01)
(52) U.S. Cl. .................. 438/115; 438/122; 438/124; 257/682; 257/E23.137
(58) Field of Classification Search ............... 438/124, 438/127, 112, 122, 115; 257/682, E23.137
See application file for complete search history.

(56) References Cited

U.S. PATENT DOCUMENTS

| 4,810,266 A * | 3/1989 | Zinnen et al. ............... 95/139 |
| 5,229,899 A | 7/1993 | Brown et al. |
| 5,361,188 A | 11/1994 | Kondou et al. |
| 5,392,177 A | 2/1995 | Chainer et al. |
| 6,128,193 A | 10/2000 | Moss et al. |
| 6,980,438 B2 | 12/2005 | Huang et al. |
| 2002/0135981 A1 | 9/2002 | Pautsch |
| 2003/0123225 A1 | 7/2003 | Miller |
| 2004/0056343 A1 | 3/2004 | Casci |
| 2006/0003592 A1 | 1/2006 | Gale et al. |
| 2006/0022592 A1* | 2/2006 | Boroson ............. 313/512 |
| 2006/0124552 A1 | 6/2006 | Nagai et al. |
| 2007/0290338 A1* | 12/2007 | Kuczynski ............. 257/737 |
| 2007/0295482 A1 | 12/2007 | Fitzgerald et al. |

FOREIGN PATENT DOCUMENTS

| JP | 60119763 | 6/1985 |
| JP | 63070547 | 3/1988 |
| JP | 05-342840 | 9/2006 |

OTHER PUBLICATIONS

Mulloth, Lila M., et al. "Carbon Dioxide Adsorption on a 5A Zeolite Designed for CO2 Removal in Spacecraft Cabins". National Aeronautics and Space Administration. Nov. 1998.
Schmidt, R.R., et al. "High-End Server Low-Temperature Cooling". IBM Research and Development. vol. 46 No. 6. Nov. 2002. pp. 739-751.

* cited by examiner

*Primary Examiner*—Wai-Sing Louie
*Assistant Examiner*—Eva Montalvo
(74) *Attorney, Agent, or Firm*—Cantor Colburn LLP; Gerry Monteleone

(57) ABSTRACT

Disclosed a multi-chip module with solder corrosion prevention including one or more chips connected to a substrate by soldering, the substrate disposed on a printed circuit board. The multi-chip module also includes a quantity of molecular sieve desiccant, and a first cover to contain the one or more chips, the substrate, and the molecular sieve desiccant, the first cover having a seal to the printed circuit board.

2 Claims, 3 Drawing Sheets

METHOD AND APPARATUS FOR PREVENTION OF SOLDER CORROSION

BACKGROUND OF THE INVENTION

1. Field of the Invention

The present invention relates in general to the field of electronics packaging. In particular, the present invention relates to electronics packaging that provides moisture and carbon dioxide adsorption for a chip module.

2. Description of the Background

Electronic components, such as microprocessors and integrated circuits, are generally packaged using electronic packages (i.e., modules) that include a module substrate to which one or more electronic components are electrically connected. A single-chip module (SCM) contains a single electronic component such as a central processor unit (CPU), memory, application-specific integrated circuit (ASIC) or other integrated circuit. A multi-chip module (MCM), on the other hand, contains two or more such electronic components.

Generally, each of these electronic components takes the form of a semiconductor chip or die having an array of spaced-apart terminals or pads on its base to provide base-down mounting of the chip to the module substrate. The module substrate is typically a ceramic carrier or other conductor-carrying substrate.

Controlled collapse chip connection (C4) solder joints are typically used to electrically connect the terminals or pads on the base of the chip with corresponding terminals or pads on the module substrate. C4 solder joints are disposed on the base of the chip in an array of minute solder balls (e.g., on the order of 100 μm diameter and 200 μm pitch). The solder balls, which are typically lead (Pb)-containing solder, are reflowed to join (i.e., electrically and mechanically) the terminals or pads on the base of the chip with corresponding terminals or pads on the module substrate.

Typically, a non-conductive polymer underfill is disposed in the space between the base of the chip and the module substrate after electrical connection thereof and encapsulates the C4 solder joints. The C4 solder joints are embedded in this polymeric underfill and are thus protected from corrosion caused by moisture and carbon dioxide in the air. However, as discussed below, the use of the polymeric chip underfill prevents the assembled chip/module substrate from being reworkable. Typically, without polymeric chip underfill, the C4 solder joints would corrode, and electrically short neighboring C4 solder joints. The presence of moisture ($H_2O$) and atmospheric carbon dioxide ($CO_2$) are the principle factors leading to corrosion of the Pb-containing C4 solder joints.

One approach has been proposed to simultaneously address the issue of C4 solder joint corrosion as well as the desire to provide reworkability. An example of such an approach is a proposed multi-chip module assembly that utilizes a C-ring seal, which is interposed between a module substrate and a cap. The C-ring seal is utilized to reduce leakage into the module cavity, thus eliminating the need for polymeric underfill to prevent corrosion of the C4 solder joints. Unfortunately, the C-ring seal requires a larger module substrate and a larger cap compared to a module utilizing underfill resulting in the loss of precious PCB real estate (i.e., the larger footprint of module substrate and cap occupies a larger area on PCB) as well as increasing manufacturing cost.

Therefore, a need exists for an enhanced method and apparatus for protecting solder joints from corrosion caused by moisture and carbon dioxide within the chip cavity of a chip module without increasing the use of PCB real estate and increasing manufacturing cost.

BRIEF DESCRIPTION OF THE INVENTION

The shortcomings of the prior art are overcome and additional advantages are realized through the provision of a multi-chip module with solder corrosion prevention including one or more chips connected to a substrate by soldering, the substrate disposed on a printed circuit board. The multi-chip module also includes a quantity of molecular sieve desiccant, and a first cover to contain the one or more chips, the substrate, and the molecular sieve desiccant, the first cover having a seal to the printed circuit board.

Additionally, a method of preventing corrosion of chip solder connections is provided whereby the molecular sieve desiccant included in the multi-chip module adsorbs moisture within a chamber created by the seal of the cover to the printed circuit board.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of embodiments of the disclosed apparatus and method are presented herein by way of exemplification and not limitation with reference to the Figures.

Figure 1:
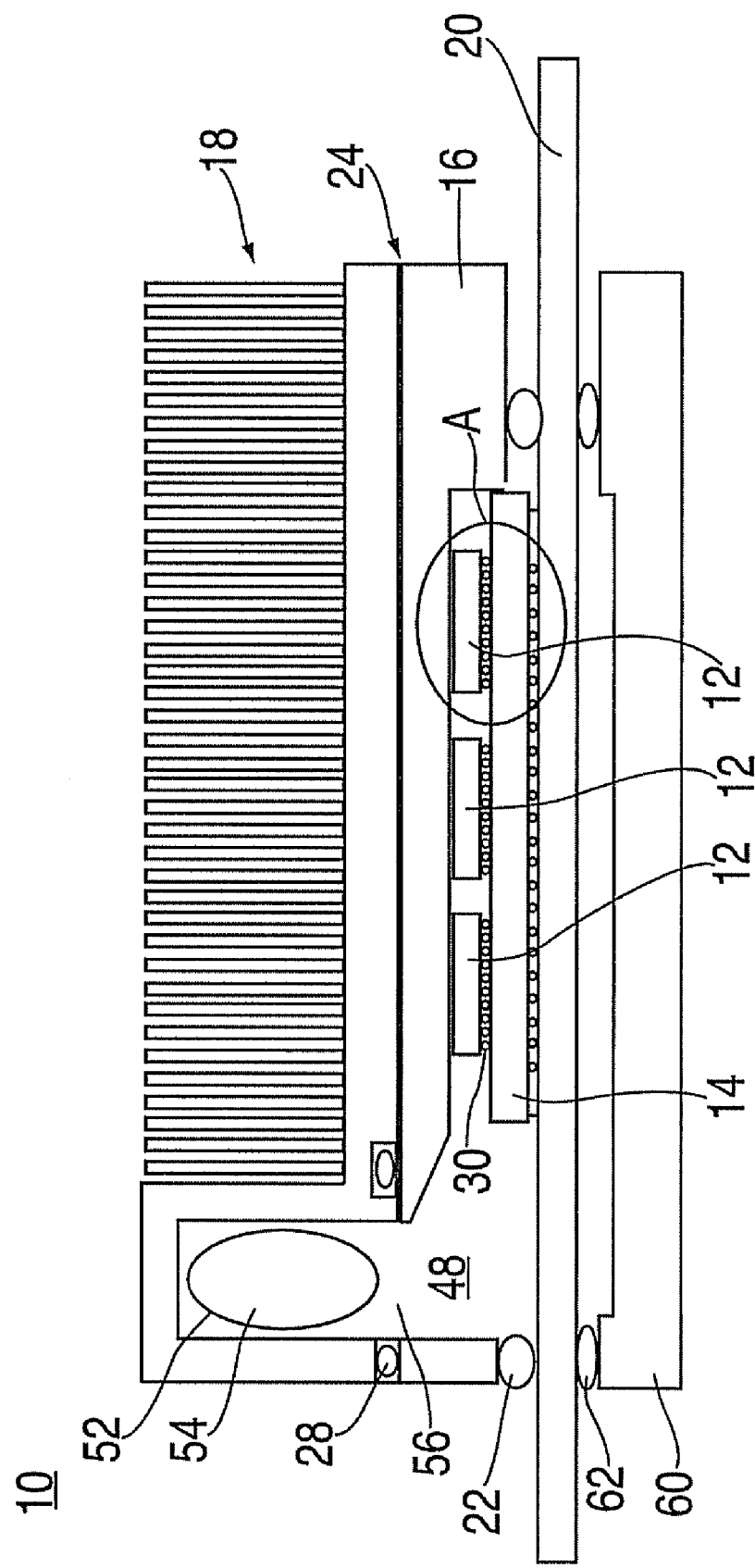
FIG. 1 is a cross sectional view of a multi-chip module with corrosion prevention features.

An embodiment of a multi-chip module (MCM) 10 that achieves improved solder joint corrosion resistance is shown in FIG. 1. The MCM 10 includes one or more chips 12 electrically connected to a module substrate 14 via controlled collapse chip connection (C4) solder joints 30. Unlike conventional MCM's, embodiments of MCM 10 do not utilize a polymeric chip underfill to protect the C4 solder joints 30 from corrosion. Omitting this element is advantageous because the chips 12 and the module substrate 14 will then be reworkable, thus reducing manufacturing costs.

Figure 2:
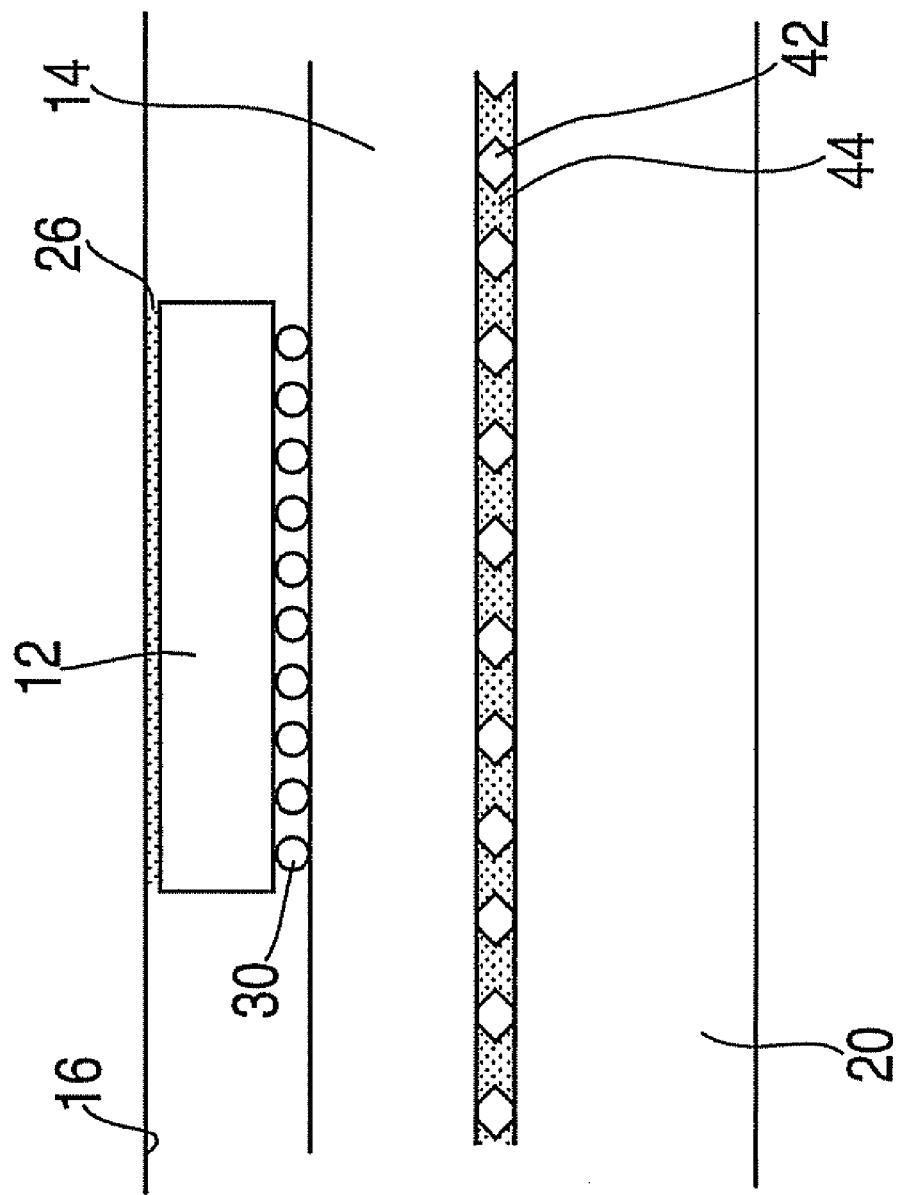
FIG. 2 is an enlarged view of the circled area "A" of FIG. 1.

The module substrate 14, in turn, is electrically connected to a printed circuit board (PCB) 20. Various configurations well known in the art are used to electrically connect a first set of contacts on the PCB 20 and a second set of contacts on the module substrate 14. These configurations include land grid array (LGA), ball grid array (BGA), column grid array (CGA), pin grid array (PGA), and the like. In the embodiment shown in FIG. 2, an LGA 40 electrically connects PCB 20 to the module substrate 14. LGA 40 may comprise, for example, conductive elements 42, such as fuzz buttons which are conductive pads disposed on the module substrate 14 to touch pins on the PCB 20, retained in a non-conductive filler, or interposer 44. One skilled in the art will appreciate, however, that any of the various other configurations may be used in lieu of, or in addition to, an LGA configuration.

Figure 3:
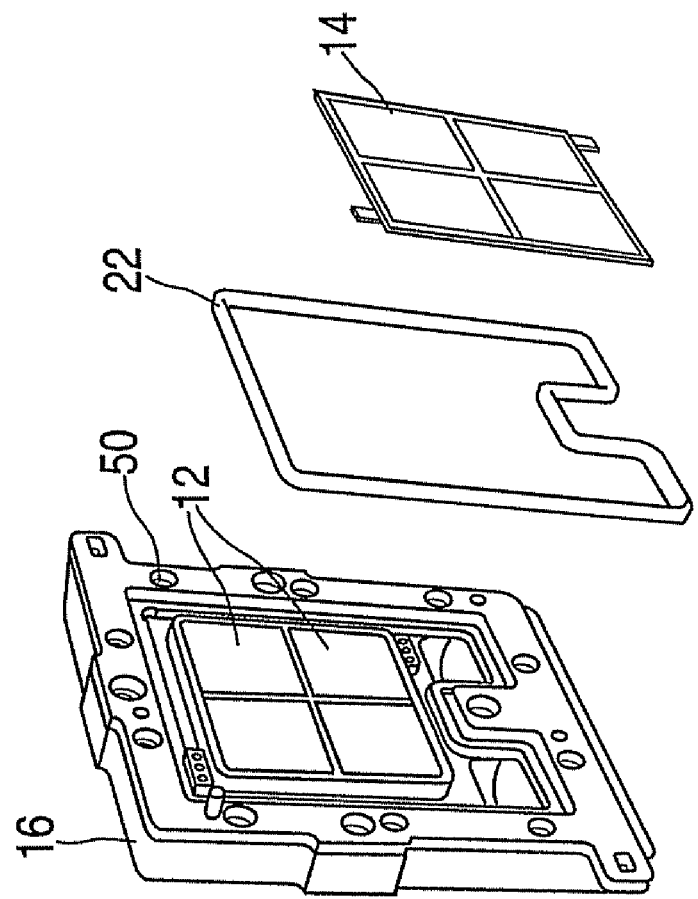
FIG. 3 is a partially exploded view of a multi-chip module with corrosion prevention features.
Figure 3:
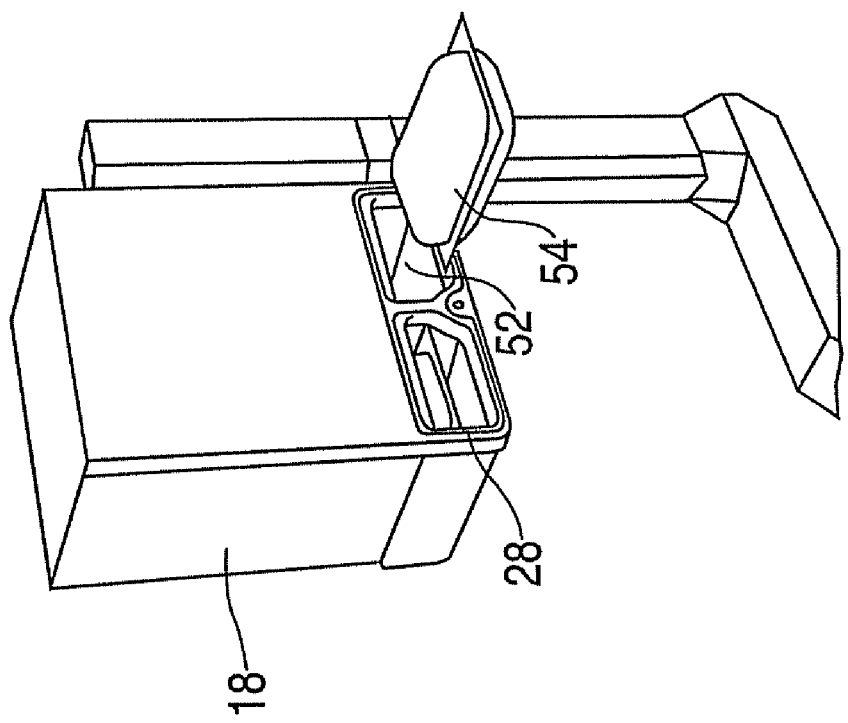

The embodiment of an MCM 10 shown in FIG. 1 also includes a cap 16. A heat sink 18 is attached to a top surface of the cap 16, with a first thermally conductive adhesive layer 24 between the heat sink 18 and the top surface of the cap 16. Heat sink 18 includes one or more molecular sieve desiccant (MSD) cavities 52. The MSD cavities 52 accept one or more permeable MSD containers 54. The cap is also attached to the one or more chips 12 with a second thermally conductive adhesive layer 26 between a bottom surface of the cap 16 and a top surface of each of the one or more chips 12. Heat sink 18 is also attached to MCM 10 through a conventional LGA mounting mechanism. In this regard, heat sink 18 includes a plurality of attachment mechanisms (not shown) that project from the bottom surface of heat sink 18. Typically, the attachment mechanisms are disposed around the footprint of the module cavity 48. As seen in FIG. 3, the attachment mechanisms pass through correspondingly positioned through-holes 50 in cap 16. The attachment mechanisms then pass through PCB 20. As is well known in the art, the attachment mechanisms cooperate with one or more compression springs (not shown) to urge MCM 10 together with force sufficient to make the electrical connections of LGA 40. Alternatively, those skilled in the art will recognize that other attachment mechanisms may be used. Generally, heat sinks, PCBs and the like, are attached to modules using a variety of attachment mechanisms, such as adhesives, clips, clamps, screws, bolts, barbed push-pins, load posts, and the like.

Returning now to FIG. 1, heat sink 18 and cap 16 cooperate with various elements to seal the one or more chips 12 and the module substrate 14 within the MCM cavity 48. For example, along the periphery of the bottom end of cap 16, a cap gasket 22 is seated on the cap 16 and urged against the top surface of PCB 20 by the conventional LGA mounting mechanism. Additionally, a heat sink gasket 28 is located along the periphery of the MSD cavity 52 portion of the bottom of the heat sink 18. The heat sink gasket 28 is seated on the heat sink 18 and urged against the top surface of the cap 16 by the conventional LGA mechanism and forms a seal between the heat sink 18 and cap 16. In one embodiment, the cap gasket 22 and/or the heat sink gasket may be formed of butyl rubber or the like.

To further enhance sealing of the MCM cavity 48, a stiffener 60 is disposed on a face of the PCB 20 directly opposite to, and with a periphery matching that of the cap 16. The stiffener 60 is attached to the PCB 20 through a conventional LGA mounting mechanism as described above. A stiffener seal 62, which in one embodiment may be formed of butyl rubber, is seated on the stiffener 60 and is urged against the bottom surface of the PCB 20 by the conventional LGA mechanism and forms a seal between the stiffener 60 and PCB 20. A component of the LGA mechanism is an array of plated through holes (PTH's) (not shown) in the PCB 20. The seal formed between the stiffener 60 and the PCB 20 by urging the stiffener seal 62 against the PCB 20 minimizes leakage of $H_2O$ and $CO_2$ into the MCM cavity 48 through the array of PTH's.

To remove moisture and $CO_2$ from the MCM cavity 48 thus preventing corrosion of the C4 solder joints 30, one or more permeable molecular sieve desiccant (MSD) containers 54 are disposed inside the MSD cavity 52. Preferably, the one or more MSD containers 54 contain a total of approximately 156 grams of MSD. The MSD containers 54 are exposed to the MCM cavity 48 via a passage 56 in the cap 16. The MSD containers 54 remove $H_2O$ and $CO_2$, the presence of which is necessary for the C4 solder joints 30 to corrode, from the air inside of the MCM cavity 48 through adsorption. Using the MSD containers 54 to remove moisture and $CO_2$ from the MCM cavity 48 eliminates the need to use other methods, such as the addition of polymeric chip underfill around the C4 solder joints 30, to prevent corrosion of the C4 solder joints 30. Furthermore, this configuration preserves the reworkability and repairability of the chip 12 and the module substrate 14.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A method of preventing corrosion of multi-chip module solder connections, comprising:
   disposing a plurality of chips at a first side of a printed circuit board;
   defining a cap comprising a heat sink;
   disposing a molecular sieve in a cavity of the heat sink, the cavity defining a portion of the cap;
   positioning the cap over the first side of the printed circuit board, thereby defining a first chamber in which the plurality of chips is frilly contained;
   sealing the cap to the first side of the printed circuit board;
   disposing a stiffener at a second side of the printed circuit board thereby defining a second chamber between the stiffener and the second side of the printed circuit board;
   sealing the stiffener at the second side of the printed circuit board; and
   adsorbing moisture within the first chamber and second chamber with the molecular sieve.

2. The method of claim 1, further comprising:
   adsorbing carbon dioxide within the first chamber and the second chamber with the molecular sieve.

* * * * *